(12) United States Patent
Shi et al.

(10) Patent No.: US 9,634,148 B2
(45) Date of Patent: *Apr. 25, 2017

(54) THIN FILM TRANSISTOR AND MANUFACTURING METHOD THEREOF

(71) Applicant: Shenzhen China Star Optoelectronics Technology Co., Ltd., Shenzhen, Guangdong (CN)

(72) Inventors: Longqiang Shi, Guangdong (CN); Zhiyuan Zeng, Guangdong (CN); Wenhui Li, Guangdong (CN); Chih-Yu Su, Guangdong (CN); Xiaowen Lv, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 85 days.

This patent is subject to a terminal disclaimer.

(21) Appl. No.: 14/440,699

(22) PCT Filed: Jan. 21, 2015

(86) PCT No.: PCT/CN2015/071196
§ 371 (c)(1),
(2) Date: May 5, 2015

(87) PCT Pub. No.: WO2016/106897
PCT Pub. Date: Jul. 7, 2016

(65) Prior Publication Data
US 2016/0343873 A1  Nov. 24, 2016

(30) Foreign Application Priority Data

Dec. 30, 2014 (CN) .......................... 2014 1 0843119

(51) Int. Cl.
*H01L 27/12* (2006.01)
*H01L 29/786* (2006.01)
(Continued)

(52) U.S. Cl.
CPC .. *H01L 29/78651* (2013.01); *H01L 21/76838* (2013.01); *H01L 23/5283* (2013.01);
(Continued)

(58) Field of Classification Search
CPC ......... H01L 29/78678; H01L 29/78669; H01L 29/66765; H01L 29/41733; H01L 29/78651
(Continued)

(56) References Cited

U.S. PATENT DOCUMENTS 5,793,072 A * 8/1998 Kuo .................... H01L 29/6675
257/241
7,998,851 B2 * 8/2011 Son ................. H01L 21/823425
257/774

(Continued)

Primary Examiner — Long K Tran
(74) Attorney, Agent, or Firm — Andrew C. Cheng

(57) ABSTRACT

The disclosure is related to a thin film transistor and a method of manufacturing the thin film transistor. The thin film transistor comprises a substrate, a first semiconductor layer, an etch stop layer and a second semiconductor layer stacked on a surface of the substrate, and a first via and a second via formed on the etch stop layer; a source and a drain formed separating from each other and the source and the drain overlapping two ends of the second semiconductor layer respectively, wherein the source connects the first semiconductor layer through the first via, and the drain connects the first semiconductor layer through the second via, a gate insulation layer formed on the source and the drain; and a gate formed on the gate insulation layer. The thin film transistor of the disclosure have a higher on-state current of the thin film transistor and a faster switching speed.

10 Claims, 4 Drawing Sheets

(51) Int. Cl.
*H01L 21/768* (2006.01)
*H01L 23/528* (2006.01)
*H01L 29/417* (2006.01)
*H01L 29/66* (2006.01)

(52) U.S. Cl.
CPC .. *H01L 29/41733* (2013.01); *H01L 29/66742* (2013.01); *H01L 29/786* (2013.01)

(58) Field of Classification Search
USPC ........................................................ 257/347
See application file for complete search history.

(56) References Cited

U.S. PATENT DOCUMENTS

| | | | | |
|---|---|---|---|---|
| 2006/0246639 | A1* | 11/2006 | Choi | H01L 29/78603 438/151 |
| 2007/0231999 | A1* | 10/2007 | Wang | H01L 29/1054 438/261 |
| 2014/0008646 | A1* | 1/2014 | Yang | H01L 29/66969 257/43 |
| 2014/0183476 | A1* | 7/2014 | Kwon | H01L 29/78603 257/40 |
| 2016/0056802 | A1* | 2/2016 | Li | H03K 19/01852 327/333 |

* cited by examiner

THIN FILM TRANSISTOR AND MANUFACTURING METHOD THEREOF

CROSS REFERENCE TO RELATED APPLICATIONS

This application claims the benefit of, and priority to, Chinese Patent Application No. 201410843119.5, filed Dec. 30, 2014, titled "Thin Film Transistor and Manufacturing Method Thereof", the entire contents of which are incorporated by reference herein in its entirety.

BACKGROUND OF THE INVENTION

1. Field of the Invention

The disclosure is related to the field of liquid crystal display, and more particularly to a thin film transistor and a method of manufacturing the thin film transistor.

2. The Related Arts

Thin film transistors (TFT) as switching elements are generally applied in the electric apparatuses with liquid crystal display devices. Thin film transistors are wildly followed with interest because of being applied on the display apparatus with high pixels per inch (PPI). For the thin film transistor, high on-state current can increase the switching speed of the thin film transistors. In order to increase the on-state current of the thin film transistors, increasing the channel width or reducing the channel length of the thin film transistor is a general solution. However, the aperture ratio of the liquid crystal display device decreases due to increasing the channel width of thin film transistor. The short channel effect is caused due to reducing the channel length of the thin film transistor. In summary, the switching speed of the thin film transistors is smaller due to the smaller on-state current of the thin film transistors in the prior art.

SUMMARY OF THE INVENTION

The embodiment of the disclosure provides a thin film transistor with higher on-state current and faster switching speed.

In one embodiment, the disclosure provides a thin film transistor comprising:

a substrate;

a first semiconductor layer, an etch stop layer and a second semiconductor layer sequentially stacked on a surface of the substrate;

a first via and a second via formed on the etch stop layer;

a source and a drain formed separating from each other and the source and the drain overlapping two ends of the second semiconductor layer respectively, wherein the source connects the first semiconductor layer through the first via; the drain connects the first semiconductor layer through the second via;

a gate insulation layer formed on the source and the drain; and a gate formed on the gate insulation layer;

In one embodiment, the thin film transistor of the disclosure further comprises a first conductive portion which connects the source and the first semiconductor layer, and connects the source and the second semiconductor layer. The first conductive part comprises a first projecting portion and a first cover portion. One end of the first projecting portion connects the first cover portion. The first projecting portion is accommodated in the first via such that the other end of the first projecting portion connects the first semiconductor layer. The first cover portion connecting the source and covering the first via is disposed on the etch stop layer.

In one embodiment, the thin film transistor of the disclosure further comprises a second conductive portion which connects the drain and the first semiconductor layer, and connects the drain and the second semiconductor layer. The second conductive portion comprises a second projecting portion and a second cover portion. One end of the second projecting portion connects one end of the second cover portion. The second projecting portion is accommodated in the second via such that the other end of the second projecting portion connects the first semiconductor layer. The second cover portion connecting the drain and covering the second via is disposed on the etch stop layer.

In one embodiment, the thin film transistor of the disclosure further comprises a first ohmic contact layer. The first ohmic contact layer is between the first via and the first semiconductor layer.

In one embodiment, the thin film transistor of the disclosure further comprises a second ohmic contact layer. The second ohmic contact layer is between the second via and the first semiconductor layer.

The disclosure further provides a method of manufacturing a thin film transistor. The thin film transistor made by the manufacturing method has higher on-state current and faster switching speed.

The method of manufacturing the thin film transistor comprises:

providing a substrate;

sequentially stacking a first semiconductor layer, an etch stop layer and a second semiconductor layer on a surface of the substrate;

forming a first via and a second via on the etch stop layer;

forming a source and a drain separating from each other and the source and the drain overlapping two ends of the second semiconductor layer respectively, wherein the source connects the first semiconductor layer through the first via; the drain connects the first semiconductor layer through the second via;

forming a gate insulation layer on the source and the drain; and forming a gate formed on the gate insulation layer.

In one embodiment, the method of manufacturing a thin film transistor of the disclosure further comprises:

forming a first conductive portion; wherein the first conductive portion comprises a first projecting portion and a first cover portion; one end of the first projecting portion connects the first cover portion; the first projecting portion is accommodated in the first via such that the other end of the first projecting portion connects the first semiconductor layer; the first cover portion connecting the source and covers the first via is disposed on the etch stop layer.

In one embodiment, the method of manufacturing a thin film transistor of the disclosure further comprises:

forming a second conductive portion; wherein the second conductive portion comprises a second projecting portion and a second to cover portion; one end of the second projecting portion connects one end of the second cover portion; the second projecting portion is accommodated in the second via such that the other end of the second projecting portion connects the first semiconductor layer; the second cover portion connecting the drain and covering the second via is disposed on the etch stop layer.

In one embodiment, the method of manufacturing a thin film transistor of the disclosure further comprises:

forming a first ohmic contact layer; the first ohmic contact layer is between the first via and the first semiconductor layer.

In one embodiment, the method of manufacturing a thin film transistor of the disclosure further comprises:

forming a second ohmic contact layer; the second ohmic contact layer is between the second via and the first semiconductor layer.

Compared the prior art, the disclosure provides a thin film transistor and manufacturing method thereof; the thin film transistor comprises a first semiconductor layer and a second semiconductor layer; wherein the first semiconductor layer and the second semiconductor layer connect to the source and the drain respectively. The second semiconductor layer serves as a semiconductor layer and the gate of the first semiconductor layer at the same time. The current of the first semiconductor layer is the first current. The current of the second semiconductor layer is the second current. The on-state current of the thin film transistor is the sum of the first current and the second current when the thin film transistor is in operating mode. The thin film transistor of the disclosure can effectively increase the on-state current of the thin film transistor and have a faster switching speed.

BRIEF DESCRIPTION OF THE DRAWINGS

In order to more clearly illustrate the prior art or the embodiments or aspects of the practice of the disclosure, the accompanying drawings for illustrating the prior art or the embodiments of the disclosure are briefly described as below. It is apparently that the drawings described below are merely some embodiments of the disclosure, and those skilled in the art may derive other drawings according the drawings described below without creative endeavor.

DETAILED DESCRIPTION OF THE PREFERRED EMBODIMENTS

The following description with reference to the accompanying drawings is provided to clearly and completely explain the exemplary embodiments of the disclosure. It is apparent that the following embodiments are merely some embodiments of the disclosure rather than all embodiments of the disclosure. According to the embodiments in the disclosure, all the other embodiments attainable by those skilled in the art without creative endeavor belong to the protection scope of the disclosure.

Figure 1:
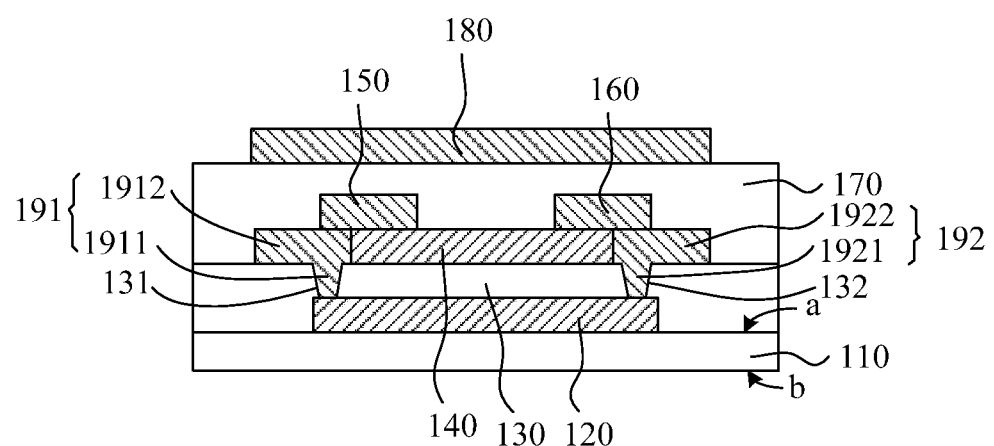
FIG. 1 is a schematic sectional view of the thin film transistor according to the embodiment of the disclosure.

Refer to FIG. 1, FIG. 1 is a schematic sectional view of the thin film transistor according to the embodiment of the disclosure. The thin film transistor 100 comprises a substrate 110, a first semiconductor layer 120, an etch stop layer 130 and a second semiconductor layer 140 sequentially stacked on a surface of the substrate, and a first via 131 and a second via 132 formed on the etch stop layer 130. The thin film transistor 100 future comprises a source 150 and a drain 160. The source 150 and the drain 160 are formed separating from each other and overlapping two ends of the second semiconductor layer 140 respectively. The source 150 connects the first semiconductor layer 120 through the first via 131. The drain 160 connects the first semiconductor layer 120 through the second via 132. The thin film transistor 100 further comprises a gate insulation layer 170 and a gate 180. The gate insulation layer 170 is formed on the source 150 and the drain 160. The gate 180 is formed on the gate insulation layer 170.

In the embodiment of the disclosure, the thin film transistor 100 is a top gate type thin film transistor. The substrate 110 is a glass substrate in the present embodiment. The substrate 110 may be a plastic substrate and not be limited to the glass substrate in other embodiments. The substrate 110 comprises a first surface "a" and a second surface "b" opposite to the first surface "a". In the present embodiment of the disclosure, the first semiconductor layer 120, the etch stop layer 130 and the second semiconductor layer 140 are sequentially stacked on the second surface "a" of the substrate 110. In other embodiments of the disclosure, the first semiconductor layer 120, the etch stop layer 130 and the second semiconductor layer 140 are sequentially stacked on the second surface "b" of the substrate 110.

In one embodiment of the disclosure, the thin film transistor 100 further comprises a buffer layer (not shown). The buffer layer is disposed on the first surface "a" of the substrate 110. The first semiconductor layer 120, the etch stop layer 130 and the second semiconductor layer 140 are sequentially stacked on the buffer layer of the first surface "a" of the substrate 110 in the present embodiment. The buffer layer is used to cushion the stress applied on the substrate 110 during the manufacturing of the thin film transistor 100 to avoid the damage and fracture of the substrate 110. The material of the buffer layer is selected from a silicon oxide layer, a silicon nitride layer, a silicon oxynitride layer, and combinations thereof. In other embodiments of the disclosure, the first semiconductor layer 120, the etch stop layer 130 and the second semiconductor layer 140 are sequentially stacked on the buffer layer of the second surface "b" of the substrate 110.

The first semiconductor layer 120 is disposed on the central portion of the first surface "a" of the substrate 110. The first semiconductor layer 120 may be formed by the following manner. The semiconductor layer is formed and patterned on the first surface "a" of the substrate 110. The first semiconductor layer 120 is formed on the central portion of the first surface "a" of the substrate 110.

The gate insulation layer 130 covers the first semiconductor layer 120 and the first surface "a" not covered by the first semiconductor layer 120. The etch stop layer 130 is used to avoid the damage of the first semiconductor layer 120 and gate 110 which are covered by the etch stop layer 130 during the manufacturing of the thin film transistor 100. A first via 131 and a second via 132 are formed on the etch stop layer 130 corresponding to two ends of the first semiconductor layer 120 respectively.

The second semiconductor layer 140 is disposed on the central portion of the etch stop layer 130. The second semiconductor layer 140 is disposed corresponding to the first via 131 and the second via 132. In other words, the second semiconductor layer 140 is disposed on the central portion of the etch stop layer 130. The second semiconductor layer 130 does not cover the first via 131 and the second via 132.

The source 150 and the drain 160 are formed on the two ends of the second semiconductor layer 140 respectively. The source 150 connects the first semiconductor layer 120 through the first via 131. The drain 160 connects the first semiconductor layer 120 through the second via 132.

The thin film transistor 100 further comprises a first conductive portion 191 connecting the source 150 and the first semiconductor layer 120. The first conductive portion 191 connects the source 150 and the first semiconductor layer 120, and connects the source 150 and the second semiconductor layer 140. The first conductive portion 191 comprises a first projecting portion 1911 and a first cover portion 1912. One end of the first projecting portion 1911 connects the first cover portion 1912. The first projecting portion 1911 is accommodated in the first via 131 such that the other end of the first projecting portion 1911 connects the first semiconductor layer 120. The first cover portion 1912 covering the first via 131 is disposed on the etch stop layer 130. The first cover portion 1912 connects the source 150 and the second semiconductor layer 140.

The thin film transistor 100 further comprises a second conductive portion 192 connecting the drain 160 and the first semiconductor layer 120. The second conductive portion 192 connects the drain 160 and the first semiconductor 120, and connects the drain 160 and the second semiconductor layer 140. The second conductive portion 192 comprises a second projecting portion 1921 and a second cover portion 1922. One end of the second projecting portion 1921 connects one end of the second cover portion 1922. The second projecting portion 1921 is accommodated in the second via 132 such that the other end of the second projecting portion 1921 connects the first semiconductor layer 120. The second cover portion 1922 covering the second via 132 is disposed on the etch stop layer 130. The second cover portion 1922 connects the drain 160 and the second semiconductor layer 140.

In one embodiment, the thin film transistor 100 further comprises a first ohmic contact layer (not shown). The first ohmic contact layer is between the first via 131 and the first semiconductor layer 120. The first ohmic contact layer is used to reduce the contact resistor between the first projecting portion 1911 and the first semiconductor layer 120 in the first via 131.

In one embodiment, the thin film transistor 100 further comprises a second ohmic contact layer (not shown). The second ohmic contact layer is between the second via 132 and the first semiconductor layer 140. The second ohmic contact layer is used to reduce the contact resistor between the second projecting portion 1921 and the first semiconductor layer 120 in the second via 132.

The thin film transistor 100 in the embodiment of the disclosure, the thin film transistor 100 comprises the first semiconductor 120 and the second semiconductor 140. The first semiconductor 120 connects to the source 150 and the drain 160. The second semiconductor 140 connects to the source 150 and the drain 160. The second semiconductor 140 serves as a semiconductor layer and the gate of the first semiconductor layer 120 at the same time. The current of the first semiconductor layer 120 is the first current Ion1. The current of the second semiconductor layer 140 is the second current Ion2. The on-state current of the thin film transistor is the sum of the first current Ion1 and the second current Ion2 when the thin film transistor 100 is in operating mode. The thin film transistor 100 of the disclosure can effectively increase the on-state current of the thin film transistor and have a faster switching speed.

Figure 2:
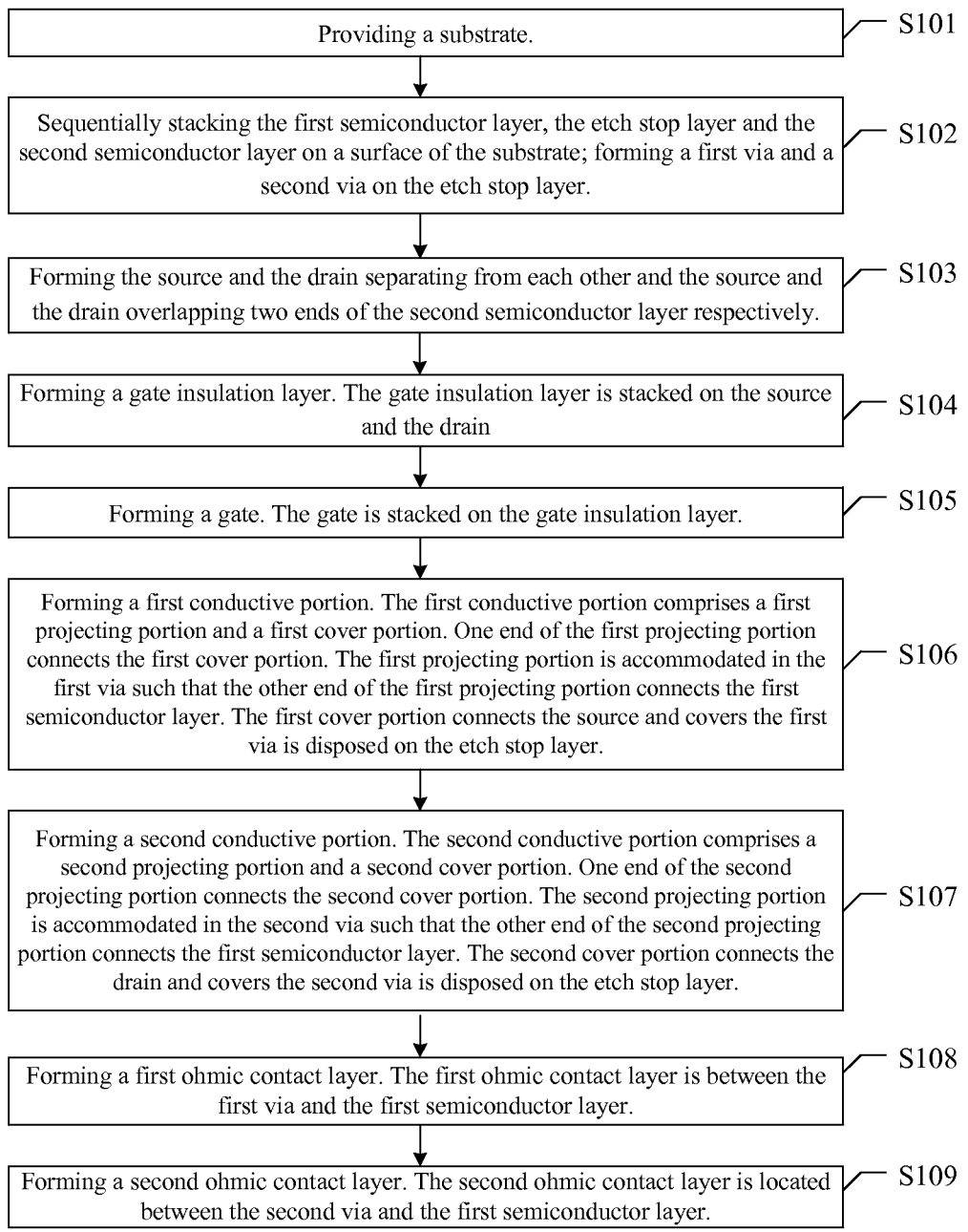
FIG. 2 is a flow chart of the method of manufacturing the thin film transistor according to the embodiment of the disclosure.

The method of manufacturing the thin film transistor 100 in conjunction with the FIG. 1 is introduced as follows. Refer to FIG. 2. FIG. 2 is a flow chart of the method of manufacturing the thin film transistor according to the embodiment of the disclosure. The method of manufacturing the thin film transistor 10 comprises but not be limited the following steps.

Figure 3:
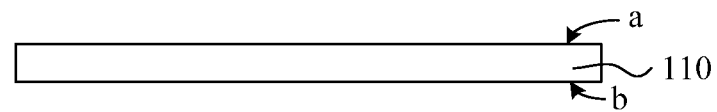
FIGS. 3-7 are schematic sectional views of the thin film transistor corresponding to the each step of the flow chart according to the embodiment of the disclosure.

Step S101, providing a substrate 110. The substrate 110 is a glass substrate in the present embodiment. The substrate 110 may be a plastic substrate and not be limited to the glass substrate in other embodiments. Refer to FIG. 3. The substrate 110 comprises a first surface "a" and a second surface "b" opposite to the first surface "a".

Figure 4:
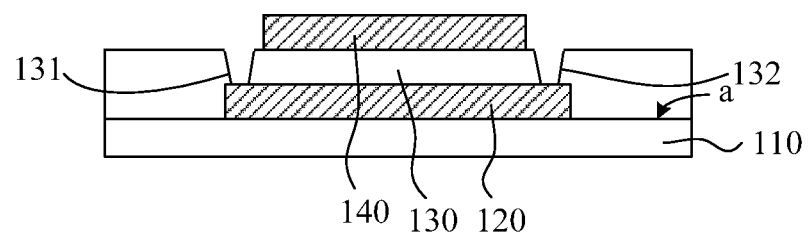

Step S102, sequentially stacking the first semiconductor layer 120, the etch stop layer 130 and the second semiconductor layer 140 on a surface of the substrate 110; forming a first via and a second via on the etch stop layer. Also refer to FIG. 4, the first semiconductor layer 120, the etch stop layer 130 and the second semiconductor layer 140 are sequentially stacked on the second surface "a" of the substrate 110. In other embodiment of the disclosure, the first semiconductor layer 120, the etch stop layer 130 and the second semiconductor layer 140 are sequentially stacked on the second surface "b" of the substrate 110.

Specifically, the first semiconductor layer 120 is disposed on the central portion of the first surface "a" of the substrate 110. The first semiconductor layer 120 may be formed by the following manner. The semiconductor layer is formed and patterned on the first surface "a" of the substrate 110. The first semiconductor layer 120 is formed on the central portion of the first surface "a" of the substrate 110.

The gate insulation layer 130 covers the first semiconductor layer 120 and the first surface "a" without covering the first semiconductor layer 120. The etch stop layer 130 is used to avoid the damage of the first semiconductor layer 120 and the substrate 110. The first via 131 and the second via 132 are formed on the etch stop layer 130 corresponding to the two ends of the first semiconductor layer 120.

The second semiconductor layer 140 is disposed on the central portion of the etch stop layer 130. The second semiconductor layer 140 is disposed corresponding to the first via 131 and the second via 132. In other words, the second semiconductor layer 140 is disposed on the central portion of the etch stop layer 130. The second semiconductor layer 140 does not cover the first via 131 and the second via 132.

In one embodiment of the disclosure, the method of manufacturing the thin film transistor 100 between step S101 and step S102 further comprises step I.

Step I, forming a buffer layer (not shown) on the surface of the substrate 110. The first semiconductor layer 120, the etch stop layer 130 and the second semiconductor layer 140 are sequentially stacked on the buffer layer of the first surface "a" of the substrate 110 in the present embodiment. In other embodiment of the disclosure, the first semiconductor layer 120, the etch stop layer 130 and the second semiconductor layer 140 are sequentially stacked on the buffer layer of the second surface "b" of the substrate 110. The buffer layer 110 is used to cushion the stress applied on the substrate 110 during the manufacturing of the thin film transistor 100 to avoid the damage and fracture of the substrate 110. The material of the buffer layer is selected from a silicon oxide layer, a silicon nitride layer, a silicon oxynitride layer, and combination thereof.

Figure 5:
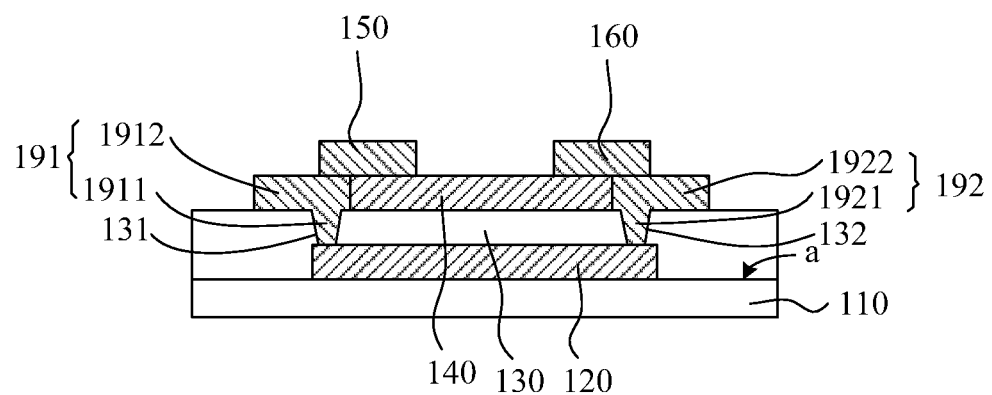

Step S103, forming the source 150 and the drain 160 separating from each other and the source 150 and the drain 160 overlapping two ends of the second semiconductor layer 140 respectively. The source 150 connects the first semiconductor layer 120 through the first via 131. The drain 160 connects the first semiconductor layer 120 through the second via 132. Refer to FIG. 5.

Figure 6:
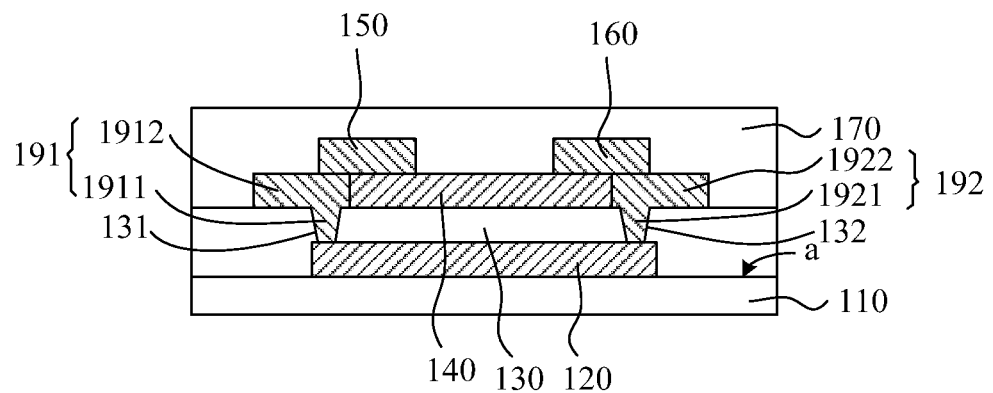

Step S104, forming a gate insulation layer 170. The gate insulation layer 170 is stacked on the source 150 and the drain 160. Refer to FIG. 6.

Figure 7:
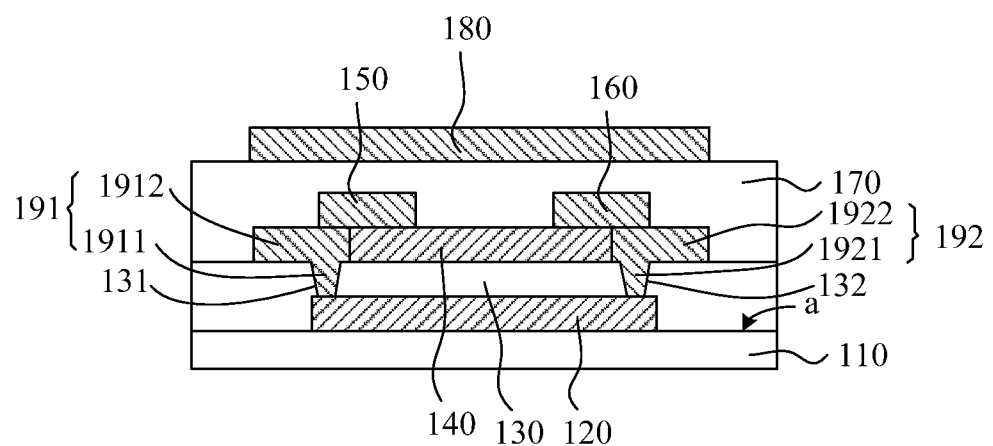

Step S105, forming a gate 180. The gate 180 is stacked on the gate insulation layer 170. Refer to FIG. 7.

In one embodiment of the disclosure, the method of manufacturing the thin film transistor 100 between step S103 and step S104 further comprises step S106.

Step 106, forming a first conductive portion 191. The first conductive portion 191 comprises a first projecting portion 1911 and a first cover portion 1912. One end of the first projecting portion 1911 connects the first cover portion 1912. The first projecting portion 1911 is accommodated in the first via 131 such that the other end of the first projecting portion 1911 connects the first semiconductor layer 120. The first cover portion 1912 connects the source 150 and covers the first via 131 is disposed on the etch stop layer 130. Refer to FIG. 5.

In one embodiment of the disclosure, the method of manufacturing the thin film transistor 100 between step S103 and step S104 further comprises step S107. Step S106 and step S107 have no specific sequence. Step S106 and step S107 of the steps can be completed in one step.

Step 107, forming a second conductive portion 192. The second conductive portion 192 comprises a second projecting portion 1921 and a second cover portion 1922. One end of the second projecting portion 1921 connects the second cover portion 1922. The second projecting portion 1921 is accommodated in the second via 132 such that the other end of the second projecting portion 1921 connects the first semiconductor layer 120. The second cover portion 1922 connects the drain 160 and covers the second via 132 is disposed on the etch stop layer 130.

The method of manufacturing the thin film transistor 100 further comprises step S108.

Step S108, forming a first ohmic contact layer (not shown). The first ohmic contact layer is between the first via 131 and the first semiconductor layer 120. The first ohmic contact layer is used to reduce the contact resistor between the first projecting portion 1911 and the first semiconductor layer 120 in the first via 131.

The method of manufacturing the thin film transistor 100 further comprises step S109.

Step S109, forming a second ohmic contact layer (not shown). The second ohmic contact layer is between the second via 132 and the second semiconductor layer 140. The second ohmic contact layer is used to reduce the contact resistor between the second projecting portion 1921 and the second semiconductor layer 140 in the second via 132.

The thin film transistor 100 in the embodiment of the disclosure, the thin film transistor 100 comprises the first semiconductor 120 and the second semiconductor 140. The first semiconductor 120 connects to the source 150 and the drain 160. The second semiconductor 140 connects to the source 150 and the drain 160. The first semiconductor 120 serves as a semiconductor layer and the gate of the second semiconductor layer 140 at the same time. The current of the first semiconductor layer 120 is the first current Ion1. The current of the second semiconductor layer 140 is the second current Ion2. The on-state current of the thin film transistor is the sum of the first current Ion1 and the second current Ion2 when the thin film transistor 100 is in operating mode. The thin film transistor of the disclosure can effectively increase the on-state current of the thin film transistor 100 and have a faster switching speed.

Note that the specifications relating to the above embodiments should be construed as exemplary rather than as limitative of the present disclosure. The equivalent variations and modifications on the structures or the process by reference to the specification and the drawings of the disclosure, or application to the other relevant technology fields directly or indirectly should be construed similarly as falling within the protection scope of the disclosure.

What is claimed is:

1. A thin film transistor, comprising:
    a substrate;
    a first semiconductor layer, an etch stop layer and a second semiconductor layer sequentially stacked on a surface of the substrate;
    a first via and a second via formed on the etch stop layer;
    a source and a drain formed separating from each other and the source and the drain overlapping two ends of the second semiconductor layer respectively, wherein the source connects the first semiconductor layer through the first via; the drain connects the first semiconductor layer through the second via;
    a gate insulation layer formed on the source and the drain;
    a gate formed on the gate insulation layer; and
    wherein, the first semiconductor serves as a semiconductor layer and the gate of the second semiconductor layer at the same time, the source and the drain are connected to the first semiconductor and the second semiconductor for effectively increasing the on-state current of the thin film transistor and have a faster switching speed.

2. The thin film transistor according to claim 1, further comprising a first conductive portion connecting the source and the first semiconductor layer; the first conductive portion connects the source and the second semiconductor layer; the first conductive portion comprises a first projecting portion and a first cover portion; one end of the first projecting portion connects the first cover portion; the first projecting portion accommodated in the first via such that the other end of the first projecting portion connects the first semiconductor layer; the first cover portion connects the source and covering the first via disposed on the etch stop layer.

3. The thin film transistor according to claim 2, further comprising a second conductive portion connecting the drain and the first semiconductor layer; the second conductive portion connects the drain and the second semiconductor layer; the second conductive portion comprises a second projecting portion and a second cover portion; one end of the second projecting portion connects one end of the second cover portion; the second projecting portion accommodated in the second via such that the other end of the second projecting portion connecting the first semiconductor layer; the second cover portion connects the drain and covering the second via disposed on the etch stop layer.

4. The thin film transistor according to claim 1, further comprising a first ohmic contact layer, the first ohmic contact layer between the first via and the first semiconductor layer.

5. The thin film transistor according to claim 4, further comprising a second ohmic contact layer, the second ohmic contact layer between the second via and the first semiconductor layer.

6. A method of manufacturing a thin film transistor, comprising:
    providing a substrate;
    sequentially stacking a first semiconductor layer, an etch stop layer and a second semiconductor layer on a surface of the substrate;
    forming a first via and a second via on the etch stop layer;

forming a source and a drain separating from each other and the source and the drain overlapping two ends of the second semiconductor layer respectively, wherein the source connecting the first semiconductor layer through the first via; the drain connecting the first semiconductor layer through the second via;

forming a gate insulation layer on the source and the drain; and forming a gate formed on the gate insulation layer;

wherein, the first semiconductor serves as a semiconductor layer and the gate of the second semiconductor layer at the same time, the source and the drain are connected to the first semiconductor and the second semiconductor for effectively increasing.

7. The method of manufacturing a thin film transistor according to claim 6, further comprising:

forming a first conductive portion; wherein the first conductive portion comprises a first projecting portion and a first cover portion; one end of the first projecting portion connects the first cover portion; the first projecting portion is accommodated in the first via such that the other end of the first projecting portion connects the first semiconductor layer; the first cover portion connects the source and covering the first via is disposed on the etch stop layer.

8. The method of manufacturing a thin film transistor according to claim 7, further comprising:

forming a second conductive portion; wherein the second conductive portion comprises a second projecting portion and a second to cover portion; one end of the second projecting portion connects one end of the second cover portion; the second projecting portion is accommodated in the second via such that the other end of the second projecting portion connects the first semiconductor layer; the second cover portion connecting the drain and covering the second via is disposed on the etch stop layer.

9. The method of manufacturing a thin film transistor according to claim 6, further comprising:

forming a first ohmic contact layer; the first ohmic contact layer is between the first via and the first semiconductor layer.

10. The method of manufacturing a thin film transistor according to claim 9, further comprising:

forming a second ohmic contact layer; the second ohmic contact layer is between the second via and the first semiconductor layer.

* * * * *